United States Patent [19]

Englund, Jr.

[11] 4,128,811
[45] Dec. 5, 1978

[54] FREQUENCY INDICATING CIRCUIT

[75] Inventor: Arvid E. Englund, Jr., Lynchburg, Va.

[73] Assignee: General Electric Company, Lynchburg, Va.

[21] Appl. No.: 812,919

[22] Filed: Jul. 5, 1977

[51] Int. Cl.² ............................................. H03D 13/00
[52] U.S. Cl. ................................... 328/134; 307/216; 307/233 R
[58] Field of Search .............................. 328/133, 134; 307/233 R, 232

[56] References Cited

U.S. PATENT DOCUMENTS

| | | | |
|---|---|---|---|
| 3,328,688 | 6/1967 | Brooks | 328/133 X |
| 3,430,148 | 2/1969 | Miki | 328/133 |
| 3,431,509 | 3/1969 | Andrea | 328/133 X |
| 3,610,954 | 10/1971 | Treadway | 307/232 |
| 3,755,746 | 8/1973 | Hogue et al. | 328/133 |
| 3,931,585 | 1/1976 | Barker et al. | 328/134 X |

*Primary Examiner*—John S. Heyman
*Attorney, Agent, or Firm*—James J. Williams

[57] ABSTRACT

The relative frequency of two signals is indicated by applying pulses indicative of the two signals to respective bistable flip-flops. The flip-flops are interconnected to produce two binary outputs each of which varies between two binary values in response to occurrence of the pulses. These binary outputs are applied to a logic circuit which produces a binary output that varies between two binary values as a function of the similarity and difference in binary values of the two flip-flop signals. The binary output of the logic circuit is applied to two further bistable flip-flops along with the pulses to control the outputs of the further flip-flops. The outputs of the further flip-flops produce respective signals which indicate the relative frequency of the two signals, and which can be used to change this relative frequency.

8 Claims, 5 Drawing Figures

FREQUENCY INDICATING CIRCUIT

BACKGROUND OF THE INVENTION

My invention relates to a frequency indicating circuit, and particularly to a frequency indicating circuit for producing signals whose characteristics show the relative frequency of two signals.

An indication of the relative frequency of two signals is needed in many electronic applications. In particular, this indication is needed where an unknown signal frequency is to be corrected or changed to conform to a reference signal frequency.

Accordingly, a primary object of my invention is to provide a new and improved circuit for indicating the relative frequencies of two signals.

Voltage controlled oscillators are used extensively in phase lock loop circuits to generate a frequency which can be varied or controlled, but which must have the basic stability of a reference frequency oscillator. Frequently, the controlled oscillator frequency is so different or so far removed from the reference oscillator frequency that the phase lock loop circuit does not have the pull-in range or ability to achieve control. As a result, the phase lock loop circuit hunts or varies continuously without achieving the desired control.

Accordingly, another object of my invention is to provide a new and improved frequency indicating circuit that produces a signal indicative of any frequency difference between two signals.

Another object of my invention is to provide a new and improved frequency indicating circuit that produces a signal which can be used with a phase lock loop circuit to acheive frequency synchronization or control, after which the phase lock loop circuit can achieve phase synchronization.

The control signal used to achieve frequency synchronization in a phase lock loop circuit may be in a circuit carrying modulation or other information which should not be changed or distorted. Accordingly, another object of my invention is to provide a frequency indicating circuit which produces a control signal that is relatively free from noise.

SUMMARY OF THE INVENTION

Briefly, these and other objects are achieved in accordance with my invention by using pulses indicative of the two frequencies. The pulses are applied to first means which produce a first binary signal of a first binary value in response to each pulse of the first frequency, and which produce a second binary signal of a second binary value in response to each pulse of the second frequency. The first and second binary signals and the pulses are applied to second means having first and second outputs. The first output produces pulses and the second output produces no signal if the first frequency exceeds the second frequency; and the second output produces pulses and the first output produces no signal if the second frequency exceeds the first frequency. If the first frequency and the second frequency are the same, neither output produces a signal. The pulse outputs can be used for any desired indication or control.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT

Figure 1:
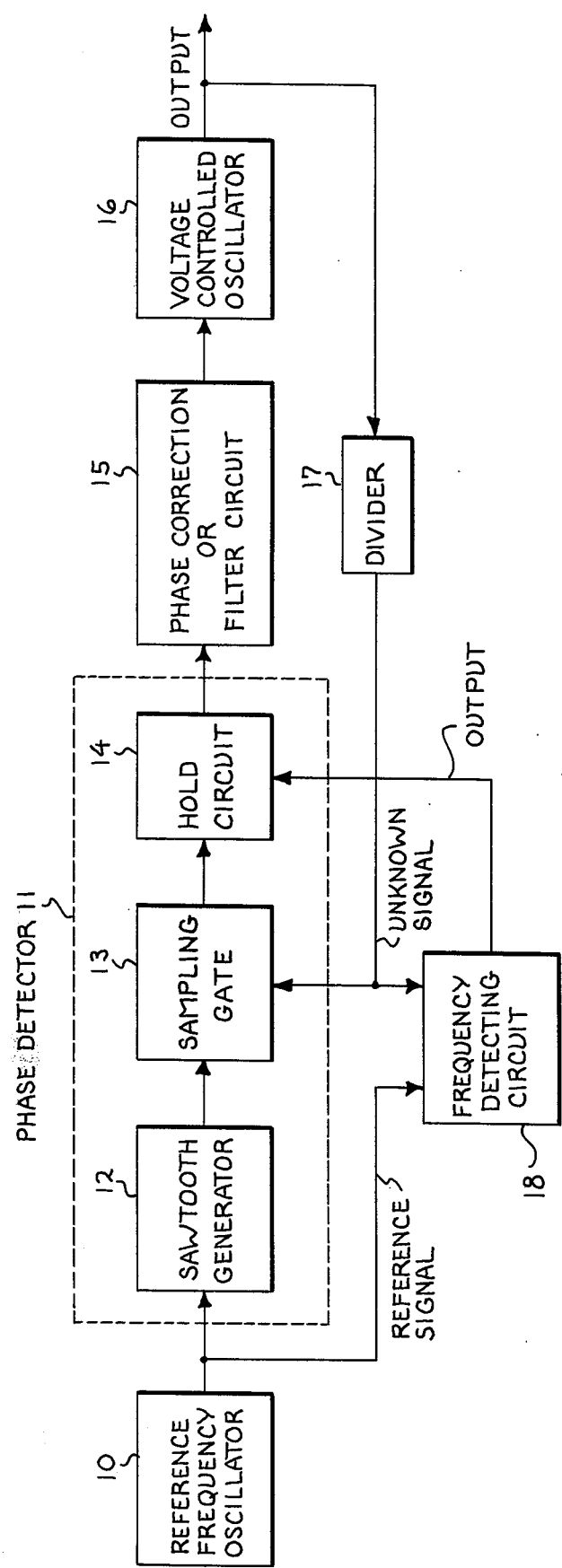
FIG. 1 shows an example of a circuit which can utilize my frequency indicating circuit.

FIG. 1 shows a phase lock loop provided with a frequency indicating circuit in accordance with my invention. However, I would like to emphasize that my frequency indicating circuit can be used in many applications. The phase lock loop of FIG. 1 includes a reference frequency oscillator 10 which typically is a stable, crystal controlled oscillator of the proper frequency. The oscillator signals are applied to a phase detector 11 shown enclosed in dashed lines. The phase detector can take many forms, but I have shown a phase detector using a sawtooth or ramp generator 12 which repetitively produces sawtooth signals that start from a low value and rise toward a high value, and that are returned to the low value each time a signal is provided by the oscillator 10. These sawtooth signals are applied to a sampling gate 13 which opens or provides a narrow amplitude sample of the sawtooth amplitude in accordance with the frequency of the unknown signal. This amplitude sample is applied to a hold circuit 14 which provides means for maintaining a signal indicative of the amplitude sample between the time of each of the samples. This signal may be applied to a phase correction or filter circuit 15 if needed, and then utilized to control the frequency of oscillation of a voltage controlled oscillator 16. The frequency of the voltage controlled oscillator 16 is considered the unknown signal which is to be controlled or made to conform to the frequency of the signal provided by the reference frequency oscillator 10. The signals from the oscillator 16 are applied to an output for utilization in any way desired. These signals are also applied back to the sampling gate 13 through a frequency divider 17 to control the time at which the gate 13 opens or provides a sample. The voltage controlled oscillator 16 produces signals whose frequency is some multiple times the frequency of the reference oscillator. This multiple is the same as the divisor provided by the divider 17. If the divider 17 divides by 5, then the frequency produced by the voltage controlled oscillator 16 is 5 times the frequency of the reference frequency oscillator. Such a circuit as described thus far is known in the art, and is used to provide a frequency which may be and usually is different from, but which has the basic stability as, a reference frequency.

The phase detector 11, and many other phase detectors presently used, have a limited range of pull-in or control. For example, if the frequency of the voltage controlled oscillator 16 were greatly different from the frequency of the reference oscillator 10, the phase detector, and particularly the sampling gate 13, might provide signals or samples which varied first in one direction and then in the other direction, so that phase lock or synchronization would never be achieved. Thus, the circuit would vary or hunt without ever achieving synchronization. Such a condition would be undesirable at best, and in many cases intolerable.

Accordingly, I provide a frequency detecting circuit 18 which can be used with many types of phase lock loop circuits and which provides greatly extended pull-in or synchronization range. My frequency detecting circuit 18 uses the same reference and unknown signals as the phase lock loop, and provides an output or indicating signal on the line between the circuit 18 and the hold circuit 14. This signal can be used in many types of phase detector circuits, and in the detector 11 of FIG. 1 would be used with the hold circuit 14.

Figure 2:
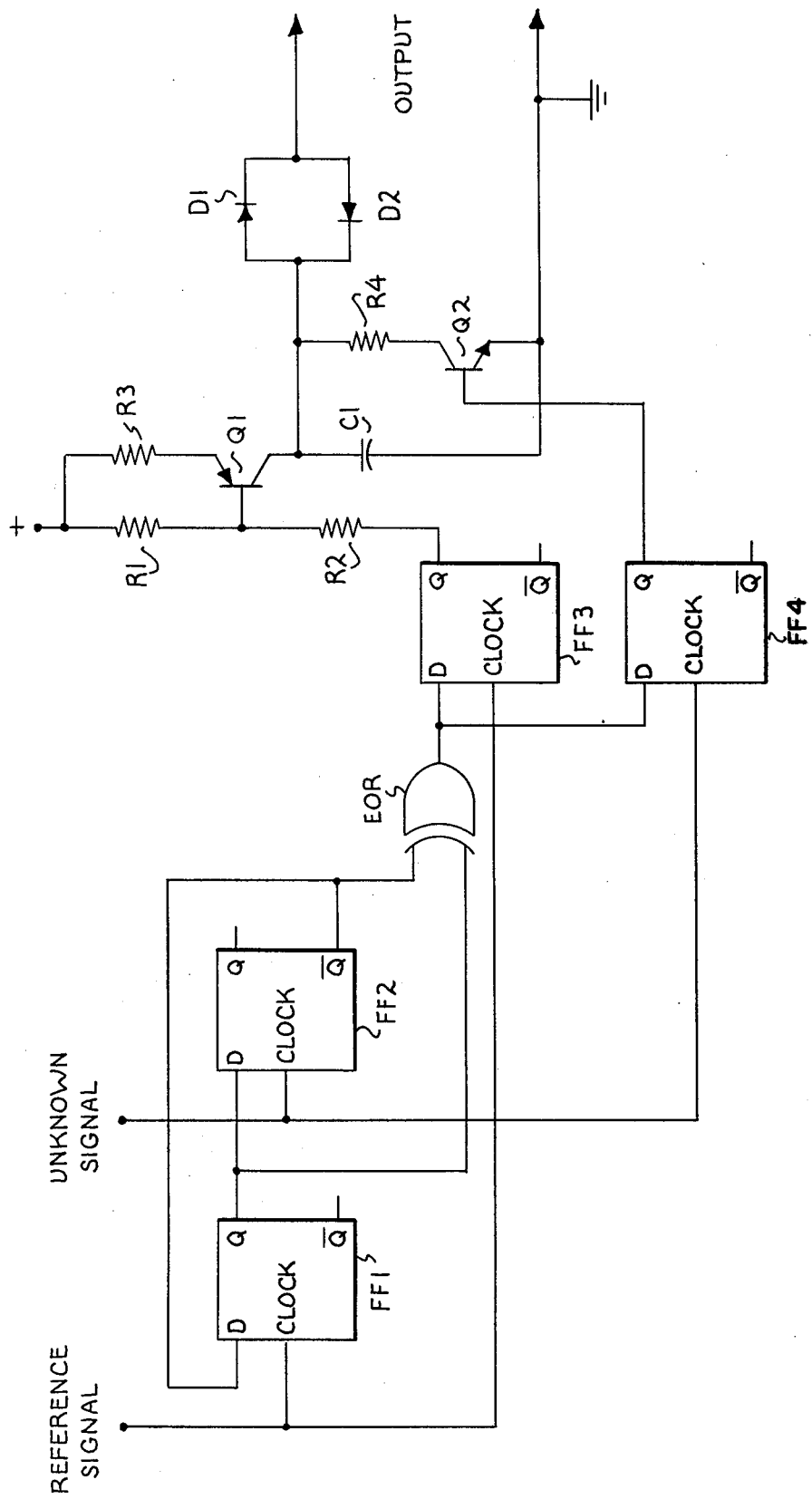
FIG. 2 shows a diagram of the preferred embodiment of my frequency indicating circuit.

FIG. 2 shows a diagram of a preferred embodiment of my frequency detecting circuit 18. The reference and unknown signals are applied as trigger or clock pulses to flip-flops FF1, FF2, FF3, FF4, so that it is very desirable that these signals be in the form of pulses having at least one rapid leading or trailing edge. If the reference and unknown signals are sinusoidal, pulses indicative of these signals can be derived in any suitable fashion, such as by a zero crossover detector and pulse circuit that gives accurate, sharply defined pulses. The flip-flops FF1, FF2, FF3, FF4 are D type flip-flops which cause the Q and $\bar{Q}$ outputs to follow the D inputs when a clock pulse is received. The reference signals are applied to the flip-flops FF1, FF3, and the unknown signals are applied to the flip-flops FF2, FF4. The Q output of the flip-flop FF1 is coupled to the D input of the flip-flop FF2, and the $\bar{Q}$ output of the flip-flop FF2 is coupled to the D input of the flip-flop FF1. The Q output of the flip-flop FF1 switches binary values in response to the reference signals, and the $\bar{Q}$ output of the flip-flop FF2 switches binary values in response to the unknown signals. The Q output of the flip-flop FF1 and the $\bar{Q}$ output of the flip-flop FF2 are applied to an EXCLUSIVE OR gate EOR which, as known in the art, produces a logic 0 when both inputs have the same binary value, either both a logic 1 or both a logic 0. In this explanation, I have assumed that a logic 1 is represented by a positive voltage and a logic 0 is represented by zero volts. If the inputs have different binary values, the EXCLUSIVE OR gate EOR produces a logic 1. The output of this part of the circuit is derived at the output of the EXCLUSIVE OR gate EOR, and generally this output switches to a logic 1 each time an unknown pulse is received, and switches to a logic 0 each time a reference pulse is received.

The output of the gate EOR is applied to both D inputs of the flip-flops FF3, FF4. The reference signals are applied to the clock input of the flip-flop FF3, and the unknown signals are applied to the clock input of the flip-flop FF4. Two outputs are derived from the Q outputs of the flip-flops FF3, FF4. When the reference signal frequency and the unknown signal frequency are equal or the same, the Q output of the flip-flop FF3 remains a logic 1, and the Q output of the flip-flop FF4 remains a logic 0. When the reference signal frequency exceeds the unknown signal frequency, the Q output of the flip-flop FF3 periodically switches from a logic 1 to a logic 0 and back to a logic 1 again, but the Q output of the flip-flop FF4 remains at a logic 0. Conversely, when the unknown signal frequency exceeds the reference signal frequency, the Q output of the flip-flop FF3 remains at a logic 1, and the Q output of the flip-flop FF4 periodically switches from a logic 0 to a logic 1 and back to a logic 0 again.

These Q outputs of the flip-flops FF3, FF4 are binary signals which can be used in any way desired to provide an indication of the relative signal frequencies. If this indication is also used to control frequency, an analog signal is desirable. This is provided by applying the Q output of the flip-flop FF3 to the base of the PNP type transistor Q1, and the Q output of the flip-flop FF4 to the base of an NPN type transistor Q2. A suitable source of voltage is provided so that the transistor Q1 can provide an emitter-collector charging current to a capacitor C1. The capacitor C1 provides an analog voltage. This charging current is available only when the transistor Q1 is turned on, and that in turn occurs when the Q output of the flip-flop FF3 is at a low value (assumed to be a logic 0). The capacitor C1 may be discharged by the transistor Q2 whose base is connected to the Q output of the flip-flop FF4. This discharge path is provided through the collector-emitter path of the transistor Q2. The transistor Q2 is turned on when its base is at a relatively positive value (assumed to be a logic 1). The analog voltage on the capacitor C1 may be applied either directly to the hold circuit 14 of FIG. 1, or may be applied through reverse poled diodes D1, D2. The diodes D1, D2 require that the voltage vary more than a predetermined range (depending upon the voltage drop of the diodes D1, D2) before this voltage can become effective.

Figure 3:
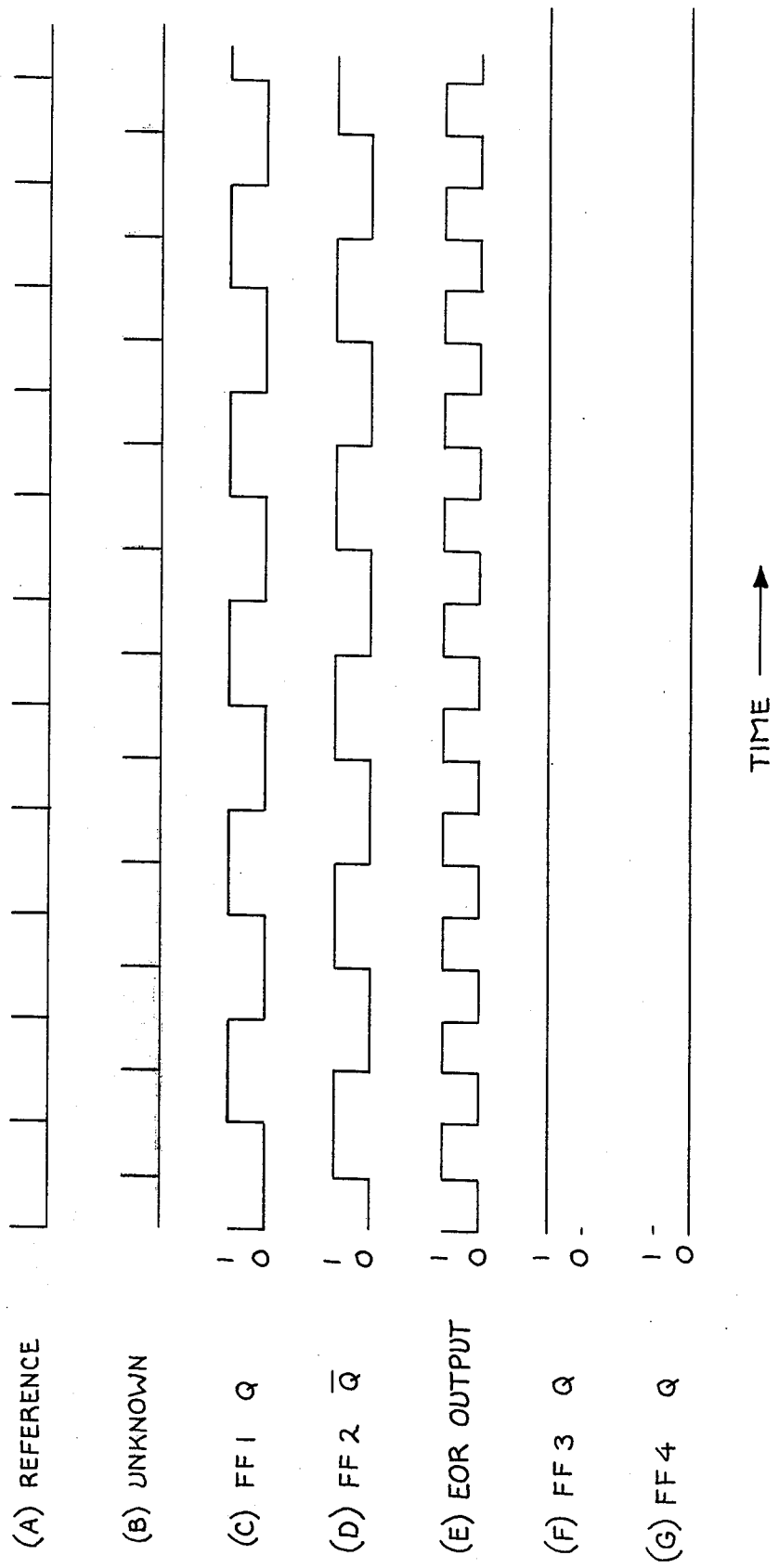
FIGS. 3, 4, and 5 show wave forms for illustrating the operation of my frequency indicating circuit.

Operation of my frequency detecting circuit will be explained in connection with the wave forms shown in FIGS. 3, 4, and 5, each of which shows binary levels or outputs plotted along a respective common time axis. In FIG. 3, I have assumed that the reference frequency pulses and the unknown frequency pulses are the same or equal as shown in FIGS. A and B. In FIGS. A and B, it will be noted that the pulses are not in phase, but the purpose of my circuit is to correct frequency, rather than phase. Phase correction can be provided by other suitable known circuits. Assuming that the $\bar{Q}$ output of the flip-flop FF2 is initially at a logic 0, this provides a logic 0 to the D input of the flip-flop FF1. When a reference pulse is received, this causes the flip-flop FF1 to switch its Q output from a logic 1 to a logic 0. This logic 0 is applied to the D input of the flip-flop FF2, so that when the unknown pulse is received, the flip-flop FF2 switches its $\bar{Q}$ output from a logic 0 to a logic 1. This sequence continues as shown in FIGS. 3C and 3D. The outputs of the flip-flops are applied to the EXCLUSIVE OR gate EOR whose output is shown in FIG. 3E. This output is a logic 0 when the outputs in FIGS. 3C and 3D are both at a logic 0 or at a logic 1, and is a logic 1 when the outputs of FIGS. 3C and 3D are different, namely a logic 0 and a logic 1, or a logic 1 and a logic 0. Generally, the EXCLUSIVE OR gate EOR produces a logic 1 when an unknown pulse is received and produces a logic 0 when a reference pulse is received.

The output of the EXCLUSIVE OR gate EOR is applied to both D inputs of the flip-flops FF3, FF4 to control these flip-flops when their respective clock pulses are received. A study of FIGS. 3E and 3A will show that each time a reference pulse is received, the EXCLUSIVE OR output is at a logic 1, or has just switched from a logic 1. This causes the Q output of the flip-flop FF3 to always remain at a logic 1. As mentioned, earlier I have assumed that this logic 1 is a relatively positive voltage which prevents the transistor Q1 from conducting. Hence, the capacitor C1 receives no charge. A study of FIGS. 3E and 3B will show that each time an unknown pulse is received, the output of the EXCLUSIVE OR gate EOR is a logic 0 or has just switched from a logic 0. This causes the Q output of the flip-flop FF4 to always remain at a logic 0. Since I have assumed that a logic 0 is zero volts, this prevents conduction of the transistor Q2 so that the capacitor C1 is not discharged. Thus, when the reference and unknown pulses have the same frequency, the Q outputs of the flip-flops FF3, FF4 remain at fixed levels so that no frequency indication or control signal is provided. These fixed levels provide very quiet operation with no spikes or other high speed variations found in other circuits.

Figure 4:
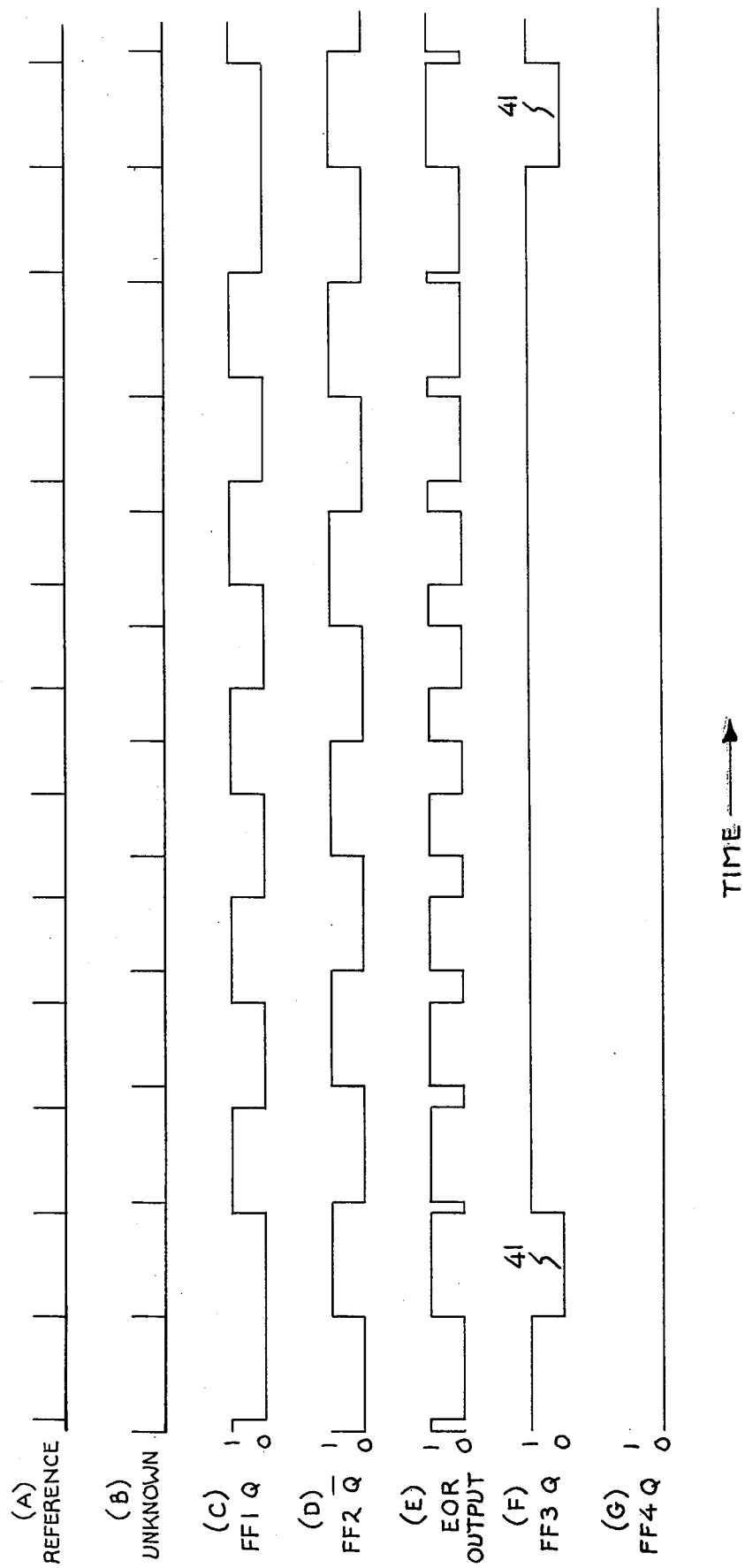

FIG. 4 shows wave forms for the circuit of FIG. 2 where the reference frequency exceeds the unknown frequency. This is shown by the pulses in FIGS. 4A and 4B. These pulses with the interconnections of the flip-flops FF1, FF2 cause the flip-flop FF1 Q output to have the values shown in FIG. 4C, and cause the $\overline{Q}$ output of the flip-flop FF2 to follow the changes shown in FIG. 4D. These outputs are applied to the EXCLUSIVE OR gate EOR which produces the binary signals shown in FIG. 4E. For most of the appropriate times, the output of the gate EOR is at a logic 1 when the reference pulse is received so that the Q output of the flip-flop FF3 is at a logic 1 for most of the time. However, at periodic intervals, the output of the EXCLUSIVE OR gate EOR is at a logic 0 when the reference pulse is received, so that the Q output of the flip-flop FF3 produces periodic logic 0 pulses 41 as shown in FIG. 4F. The total time durations of these pulses vary as a function of the difference between the reference frequency and the unknown frequency. As the frequency difference increases, the time duration increases. Between pulses, the circuit is quiet. These logic 0 pulses cause the transistor Q1 to conduct and provide a charge on the capacitor C1. This charge indicates that the reference frequency exceeds the unknown frequency, and may be used to raise the unknown frequency. With respect to the output of the flip-flop FF4, it remains at a steady logic 0 as shown in FIG. 4G, and hence is quiet. This is because the output of the EXCLUSIVE OR gate EOR is at a logic 0 each time the unknown pulse is received. Hence, the transistor Q2 is not turned on, and the capacitor C1 is not discharged.

Figure 5:
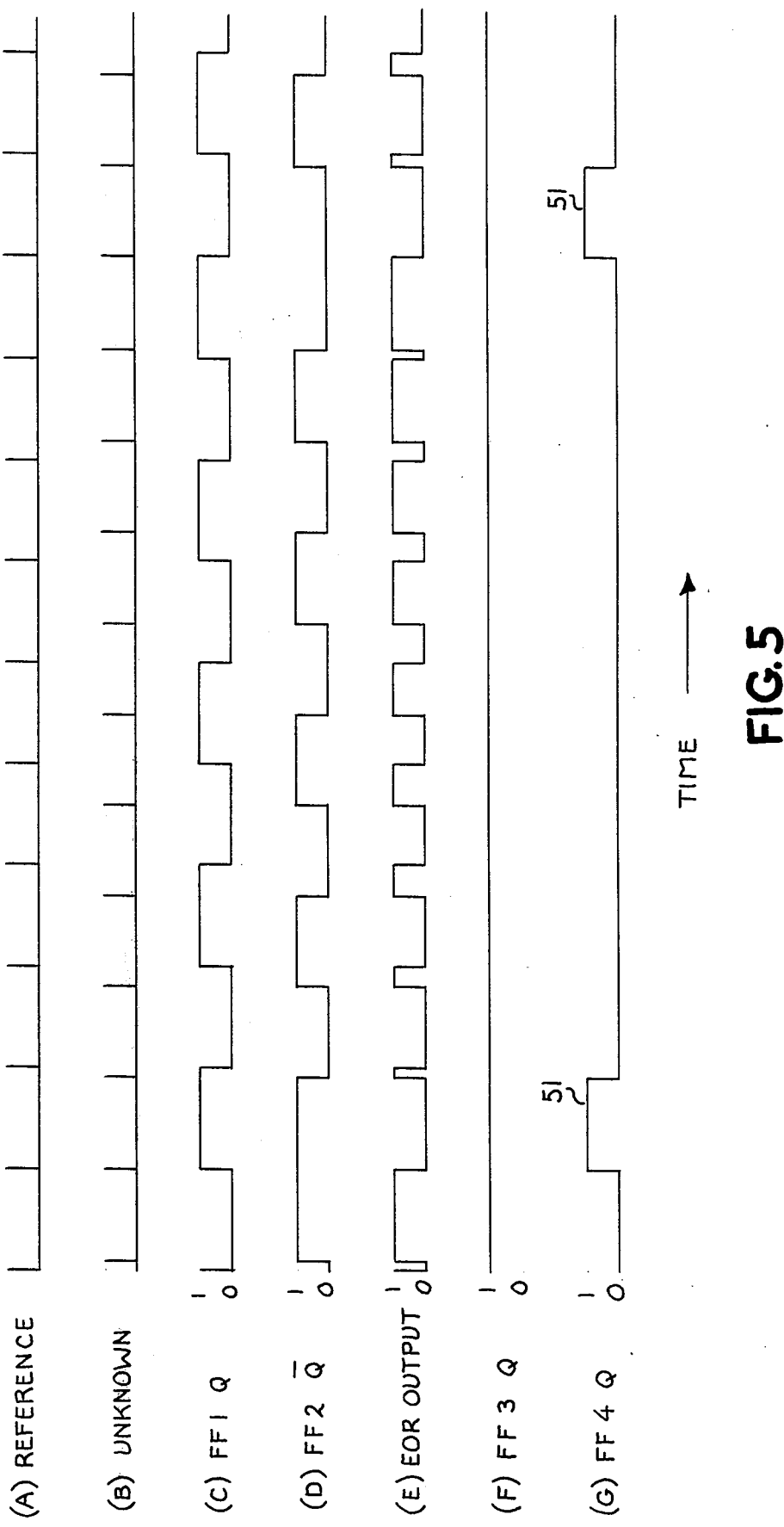

FIG. 5 shows the condition where the unknown frequency exceeds the reference frequency. In this case, the Q output of the flip-flop FF3 remains at a steady logic 1 so that the transistor Q1 is never turned on to charge the capacitor C1. However, at periodic intervals, the Q output of the flip-flop FF4 switches from a logic 0 to a logic 1 to provide pulses 51 which turn on the transistor Q2. Between these pulses, the circuit is quiet. This output can be used to indicate that the unknown frequency exceeds the reference frequency, and can also be used to discharge the capacitor C1. Discharge of the capacitor C1 could be used to lower the unknown frequency.

In summary, my circuit provides binary outputs from the flip-flops FF3, FF4 which, indicate any frequency difference and which can provide pull-in for that difference. As shown by the waveforms of FIGS. 3F, 3G, 4F, 4G, 5F, and 5G, my circuit is very quiet. None of the high speed switching or pulsing in the previous part of my circuit, as exemplified by wave forms A through E of FIGS. 3, 4, and 5, appears at these outputs. Hence, by circuit provides quiet operation and good noise protection or isolation.

While I have shown only one embodiment of my invention, persons skilled in the art will appreciate that modifications may be made. For example, the binary levels of logic 1 and logic 0 may have any suitable voltage. Also, other circuits which perform the same function as the flip-flops FF1, FF2, and the gate EOR may be provided. Other circuits may be provided for the flip-flops FF3, FF4. Also, other types of arrangements may be used in place of the capacitor C1, for example, an up-down counter and associated circuits. Visual indications may also be derived from the outputs of the flip-flops FF3, FF4, either at the Q outputs or the $\overline{Q}$ outputs depending upon circuit voltages and arrangements. The diodes D1, D2 may be omitted. And finally, the analog voltage on the capacitor C1 may be used by itself for any desired purpose, as well as being used with a phase lock loop as shown in FIG. 1. Therefore, while my invention has been described with reference to a particular embodiment, it is to be understood that modifications may be made without departing from the spirit of the invention or from the scope of the claims.

What I claim as new and desire to secure by Letters Patent of the United States is:

1. A circuit for indicating the relative frequency of first and second repeating signals, the frequencies of said first and second signals being respectively indicated by first and second repeating pulses, said circuit comprising:
   a. first input means for said first pulses;
   b. second input means for said second pulses;
   c. third means having an exclusive OR device, said third means being connected to said first and second input means for producing at an output a binary signal which switches to a first value in response to receipt of each of said first pulses and which switches to a second value in response to receipt of each of said second pulses;
   d. and fourth means having first and second outputs and having inputs, said fourth means inputs being connected to said third means output and to said first and second input means for producing a first value binary signal at said first output in response to said second frequency being equal to or greater than said first frequency; for producing a second value binary signal at said second output in response to said first frequency being equal to or greater than said second frequency; for producing a second value binary signal at said first output in response to said first frequency being greater than said second frequency; and for producing a first value binary signal at said second output in response to said second frequency being greater than said first frequency.

2. The circuit of claim 1 wherein said second value binary signals produced at said first output of said fourth means and said first value binary signals produced at said second output of said fourth means have durations that vary as a function of the difference between said first and second frequencies.

3. A circuit for producing output signals indicative of the relative frequency of first and second recurring signals, said circuit comprising:
   a. first input terminals for the first of said signals;
   b. second input terminals for the second of said signals;
   c. gating means connected to said first and second input terminals for producing a first binary output in response to each occurrence of said first and second signals having different binary characteristics, and for producing a second binary output in response to each occurrence of said first and second signals having the same binary characteristics;

d. and first and second bistable means respectively connected to said first and second input terminals and both connected to said gating means; said first bistable means producing a first binary output signal in response to simultaneous occurrence of said first binary output and a selected portion of said first signal, and producing a second binary output signal in response to simultaneous occurrence of said second binary output and a selected portion of said first signal; and said second bistable means producing a second binary output signal in response to simultaneous occurrence of said second binary output and a selected portion of said second signal, and producing a first binary output signal in response to simultaneous occurrence of said first binary output and a selected portion of said second signal.

4. The circuit of claim 3 and further comprising third and fourth bistable means respectively connected between said first input terminals and said gating means and between said second input terminals and said gating means.

5. A circuit for determining the relative frequency of first and second signals whose respective frequencies are indicated by first and second repetitive pulses, and for producing output signals indicative of the relative frequency of said first and second signals, said circuit comprising:

a. first bistable means having a control input, a pulse input for receiving said first pulses, and an output which switches logic states in response to said first pulses and as a function of the logic signal applied to said control input;
   b. second bistable means having a control input, a pulse input for receiving said second pulses, and an output which switches logic states in response to said second pulses and as a function of the logic signal applied to said control input;
   c. third means connecting said output of each of said first and second bistable means to said control input of the other of said bistable means to produce alternating logic signals at said outputs which vary as a function of said first and second pulses;
   d. fourth means connected to said outputs of said bistable means for producing a first logic signal in response to said logic signals at said outputs being the same and for producing a second logic signal in response to said logic signals at said outputs being different;
   e. third bistable means having a control input connected to said fourth means, a pulse input for receiving said first pulses, and an output which switches logic states in response to said first pulses and as a function of the logic signal applied to said control input;
   f. fourth bistable means having a control input connected to said fourth means, a pulse input for receiving said second pulses, and an output which switches logic states in response to said second pulses and as a function of the logic signal applied to said control input;
   g. and means connected to said outputs of said third and fourth bistable means for deriving frequency indicative signals therefrom.

6. A circuit for producing output signals indicative of the relative frequency of a reference signal and an unknown signal, said circuit comprising:

a. first and second flip-flops each having a pulse input, a control input, and a logic output, said logic output of said second flip-flop being the logic inversion of said logic output of said first flip-flop;
   b. means for applying reference pulses indicative of the frequency of said reference signals to said clock input of said first flip-flop and for applying unknown pulses indicative of the frequency of said unknown signals to said clock input of said second flip-flop;
   c. means for connecting said logic output of said first flip-flop to said control input of said second flip-flop and for connecting said logic output of said second flip-flop to said control input of said first flip-flop;
   d. an exclusive OR gate having first and second inputs respectively connected to said logic outputs of said first and second flip-flops;
   e. third and fourth flip-flops each having a pulse input, a control input and a logic output;
   f. means connecting both of said control inputs of said third and fourth flip-flops to the output of said exclusive OR gate;
   g. means for applying said reference pulses to said clock input of said third flip-flop and for applying said unknown pulses to said clock input of said fourth flip-flop;
   h. and means connected to said logic outputs of said third and fourth flip-flops for deriving signals therefrom.

7. The improved circuit of claim 6 wherein said means connected to said outputs of said third and fourth flip-flops comprise digital to analog conversion means.

8. A circuit for indicating the relative frequency of reference pulses and unknown pulses, said circuit comprising:

a. first and second bistable flip-flops having means for receiving said reference and unknown pulses respectively and being connected together so that said first flip-flop switches states upon receipt of each of said reference pulses and so that said second flip-flop switches state upon receipt of each of said unknown pulses;
   b. exclusive Or means connected to the outputs of said first and second flip-flops;
   c. a third bistable flip-flop having an input connected to the output of said exclusive OR means and responsive to said reference pulses;
   d. a fourth bistable flip-flop having an input connected to said output of said exclusive OR means and responsive to said unknown pulses;
   e. said third bistable flip-flop producing a steady state signal in response to said reference pulse frequency being equal to or less than said unknown pulse frequency, and producing output pulses in response to said reference pulse frequency exceeding said unknown pulse frequency; and said fourth flip-flop producing a steady state signal in response to said unknown pulse frequency being equal to or less than said reference pulse frequency, and producing output pulses in response to said unknown pulse frequency exceeding said reference pulse frequency.

* * * * *